United States Patent
Oda et al.

(10) Patent No.: US 11,778,792 B2
(45) Date of Patent: Oct. 3, 2023

(54) HOUSING FOR POWER CONVERSION APPARATUS

(71) Applicant: Toshiba Mitsubishi-Electric Industrial Systems Corporation, Tokyo (JP)

(72) Inventors: Kenji Oda, Tokyo (JP); Kenichiro Omote, Tokyo (JP); Ryo Nakajima, Tokyo (JP)

(73) Assignee: Toshiba Mitsubishi-Electric Industrial Systems Corporation, Tokyo (JP)

( * ) Notice: Subject to any disclaimer, the term of this patent is extended or adjusted under 35 U.S.C. 154(b) by 538 days.

(21) Appl. No.: 17/078,592

(22) Filed: Oct. 23, 2020

(65) Prior Publication Data

US 2021/0190552 A1 Jun. 24, 2021

Related U.S. Application Data

(63) Continuation of application No. PCT/JP2018/016736, filed on Apr. 25, 2018.

(51) Int. Cl.
*H05K 7/20* (2006.01)
*H02M 7/00* (2006.01)
(Continued)

(52) U.S. Cl.
CPC ......... *H05K 7/20909* (2013.01); *G01D 11/24* (2013.01); *H02M 1/32* (2013.01);
(Continued)

(58) Field of Classification Search
CPC ........... H05K 7/20909; H05K 7/14325; H05K 7/20181; G01D 11/24; H02M 1/32; H02M 7/003; H02M 7/48; H02M 1/327
See application file for complete search history.

(56) References Cited

U.S. PATENT DOCUMENTS 5,046,451 A * 9/1991 Inslee .................... A01K 61/10
                                                          210/167.26
10,799,838 B1 * 10/2020 Brookins .............. B05B 7/0075
(Continued)

FOREIGN PATENT DOCUMENTS

JP      03-140469 A      6/1991
JP      2000-325726 A    11/2000
(Continued)

OTHER PUBLICATIONS

International Search Report dated Jul. 17, 2018 in PCT/JP2018/016736 filed on Apr. 25, 2018, citing documents AP-AS therein, 1 page

*Primary Examiner* — Yusef A Ahmed
(74) *Attorney, Agent, or Firm* — Oblon, McClelland, Maier & Neustadt, L.L.P.

(57) ABSTRACT

A power conversion apparatus is provided to prevent the arc flash generated in a board from flowing out to a operation surface for operating the board, and also to relieve the pressure inside the board to the outside from the flapper section provided on the ceiling. The power conversion apparatus that has taken measures against an arc flash composed of a power converter and a board accommodating the power converter is provided. A BUS which constitutes the power converter has the first processing that makes it hard to fly the flash in a place where arc flash is not desired to occur. A door is placed on the front board that can be opened and closed by the operator. The board has an explosion-proof shutter part to prevent the arc flash from being released to the outside by the pressure inside the board, and has a flapper section for releasing the pressure inside the board to the outside from the ceiling of the board unit, when the arc flash occurs.

7 Claims, 6 Drawing Sheets

(51) Int. Cl.
*G01D 11/24* (2006.01)
*H02M 1/32* (2007.01)
*H02M 7/48* (2007.01)

(52) U.S. Cl.
CPC ............. *H02M 7/003* (2013.01); *H02M 7/48* (2013.01); *H02M 1/327* (2021.05)

(56) References Cited

U.S. PATENT DOCUMENTS

| | | | | |
|---|---|---|---|---|
| 2005/0082734 A1* | 4/2005 | Goto | ...................... | B65H 43/00 |
| | | | | 271/1 |
| 2006/0011111 A1* | 1/2006 | Stoddard | ................... | E05G 1/00 |
| | | | | 109/1 R |
| 2006/0254228 A1* | 11/2006 | Moktader | .............. | F02M 25/12 |
| | | | | 55/418 |
| 2007/0125474 A1* | 6/2007 | Barker | ................ | B65H 37/005 |
| | | | | 156/577 |
| 2009/0183763 A1* | 7/2009 | Meyer | ..................... | H02S 40/32 |
| | | | | 136/246 |
| 2014/0103062 A1* | 4/2014 | Rose, Jr. | .................. | G07F 11/34 |
| | | | | 221/124 |
| 2014/0202088 A1* | 7/2014 | Nakajima | ............. | E04B 1/3444 |
| | | | | 52/79.5 |
| 2016/0016829 A1* | 1/2016 | Hughes | ................... | C02F 1/487 |
| | | | | 204/663 |
| 2017/0172015 A1* | 6/2017 | Yu | ......................... | H05K 5/0217 |
| 2018/0047499 A1* | 2/2018 | Smith | ................... | H01F 27/321 |
| 2018/0249595 A1* | 8/2018 | Ashbaugh | .......... | H05K 7/20909 |
| 2019/0246527 A1* | 8/2019 | Ionescu | .............. | H05K 7/20909 |
| 2021/0123233 A1* | 4/2021 | Li | ......................... | F25D 17/042 |
| 2021/0243920 A1* | 8/2021 | Inamasa | ............. | H02M 7/003 |
| 2022/0264773 A1* | 8/2022 | Steidl | ................. | H05K 7/20572 |
| 2022/0311223 A1* | 9/2022 | Calhau Gonçalves | ..................... | |
| | | | | H02B 13/025 |
| 2023/0080951 A1* | 3/2023 | Allgeier | ................ | A01G 9/12 |
| | | | | 47/62 R |

FOREIGN PATENT DOCUMENTS

| | | |
|---|---|---|
| JP | 2004-281489 A | 10/2004 |
| JP | 2009-103650 A | 5/2009 |
| JP | 2012-005242 A | 1/2012 |

\* cited by examiner

HOUSING FOR POWER CONVERSION APPARATUS

CROSS-REFERENCE TO RELATED APPLICATION

This application is based upon and claims the benefit of priority from the prior PCT Patent Application No. PCT/JP2018/16736, filed on Apr. 25, 2018, the entire contents of which are incorporated herein by reference.

TECHNICAL FIELD

The embodiment of the present invention relates to a power conversion apparatus.

BACKGROUND ART

A power conversion apparatus that converts a large capacity of power may handle a high voltage or a large current of about 3,800 Vrms AC. In that case, a board structure is often adopted. Further, in the power conversion apparatus, it is necessary to reduce the inductance in order to suppress a surge voltage. In this case, input side AC bus bar, output bus bar, and DC bus bar need to be insulatively coated to form a close contact structure. Therefore, inside of the power conversion apparatus has a complicated bus bar structure.

Forced air cooling is generally used in such power conversion apparatus. Forced air cooling power conversion apparatus is generally installed indoors and is used in a defined ambient environment. In this case, it is undeniable that an arc flash may occur in the board due to unexpected deterioration of the surrounding environment. Here, a short circuit phenomenon due to arc discharge through air is referred to as arc flash.

As an explosion-proof device that has taken measures against arc flash, main components of the explosion-proof device are classified into a first case and a second case according to the explosion-proof specification level, and the explosion-proof device that has taken the explosion-proof measures accordingly, is disclosed (for example, See Patent Document 1).

PRIOR ART DOCUMENT

Patent Document

Patent document 1: Japanese Patent Publication No. 2009-103650

SUMMARY OF THE INVENTION

Problem to be Solved by the Invention

However, in recent years, even in an inverter that configures the power conversion apparatus, when an unexpected arc flash occurs in the power conversion apparatus, a structure that does not release the high temperature gas or pressure wave accompanying it to the operation surface has come to be required. In this respect, the device described in Patent Document 1 does not disclose a method of appropriately releasing the internal pressure of the device when explosion trouble occurs. Therefore, in the case of explosion protection due to unexpected explosion trouble that is not in the explosion protection specifications or deterioration of the device, the device has a safety problem because it cannot release the pressure inside the device properly.

In addition, there is a demand from the user of the power conversion apparatus to reduce the installation area, and small-sized high-density mounting is applied. In this case, if an accident occurs in which an arc flash generates, the energy density due to the arc flash increases because of the size reduction, and there is a problem that parts in the device may be damaged.

Means for Solving the Problem

In order to achieve the above object, a power conversion apparatus according to claim 1 of the present invention comprises a first conductor portion, a second conductor portion, an openable/closable board door, a vent hole arranged in the board door, and a flapper section on a ceiling part, wherein, the first conductor portion, which is arranged at a place where arc flash is not desired to be generated, is subjected to a first processing for relaxing the surface electric field of the conductor as compared with the second conductor, the vent hole has a shutter part composed of a plurality of louvers consisting of a fixed part that makes a fulcrum composed of a plurality of metal plates, and a movable part, the plurality of louvers has the movable part arranged so as to overlap the fixed part of the other louver when the movable part of one louver rotates in the outer direction of the power conversion apparatus, and the plurality of louvers are configured to ensure air permeability from the outside to the inside of the power conversion apparatus when the movable part of the plurality of louvers rotates in the inner direction of the power conversion apparatus, and the flapper section includes, a window portion between the inside and the outside of the power conversion apparatus, a frame body arranged around the window portion, and two doors fixed to both ends of the frame body so as to be opened and closed in a double door shape toward the outside of the power conversion apparatus at the central portion of the window portion.

Effects of the Invention

According to the present invention, it is possible to suppress the occurrence of arc flash in a portion of the power conversion apparatus which is not desired to be generated, even under the condition that arc flash occurs. Further, it is possible to provide a power conversion apparatus capable of improving safety and reducing damage to the inside of the apparatus by releasing the pressure inside the apparatus to the outside by a flapper section arranged on the ceiling.

BRIEF DESCRIPTION OF THE DRAWINGS

FIGS. 1A and 1B are an outline views of a board composed of a plurality of board units constituting the power conversion apparatus according to the first embodiment.

FIGS. 2A, 2B and 2C are side perspective views showing a state when an arc flash occurs in the board unit shown in FIGS. 1A and 1B.

FIG. 3B and FIG. 3C are diagrams for explaining the operation when the arc flash occurs.

EMBODIMENT TO PRACTICE THE INVENTION

Hereinafter, embodiment of the present invention will be described with reference to the drawings.

Embodiment 1

Figure 1A:
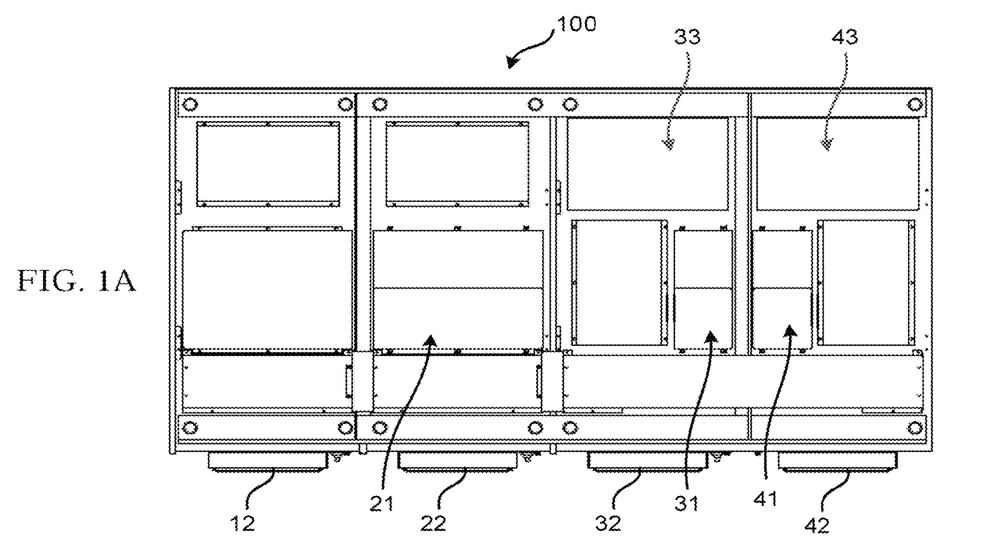
FIG. 1A is a plan view.
Figure 1B:
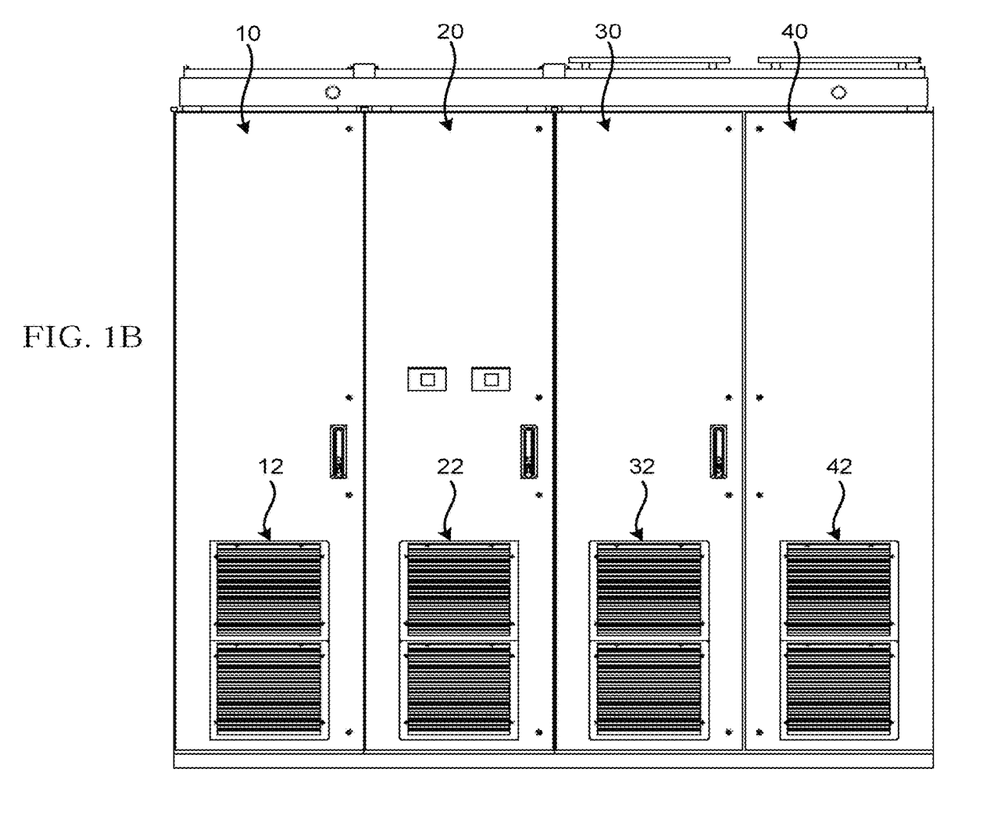
FIG. 1B is a front view.

FIGS. 1A and 1B is an external view of a power conversion apparatus 100 in which a plurality of board units forming the power conversion apparatus according to the first embodiment are arranged in a row. FIG. 1A is a plan view of the power conversion apparatus 100, and FIG. 1B is a front view of the power conversion apparatus 100. Hereinafter, the components related to the arc flash countermeasure according to the present embodiment will be mainly described.

The illustrated power conversion apparatus 100 is an example of a case where it is configured by four board units 10, 20, 30, and 40 (hereinafter referred to as board units 10 to 40 when the board units are not distinguished). Each board unit 10-40 has a rectangular parallelepiped shape, and has a front door that can be opened and closed is provided on the front side of each board unit 10-40 so that an operator can access the inside of each board unit 10-40. Further, under the front door, explosion-proof shutter parts 12, 22, 32, and 42 forming a vent are arranged.

Also, flapper sections 21, 31, and 41 are arranged on the ceiling parts of the board units 20, 30, 40, respectively. Fan cover portions 33 and 43 are further arranged on the ceiling parts of the board units 30 and 40.

Figure 2A:
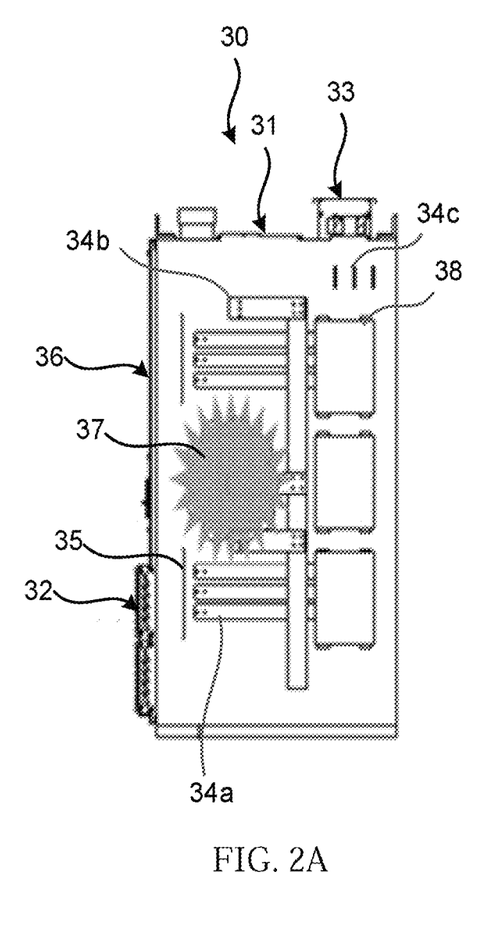
FIG. 2A shows a state at the time when an arc flash generates.
Figure 2B:
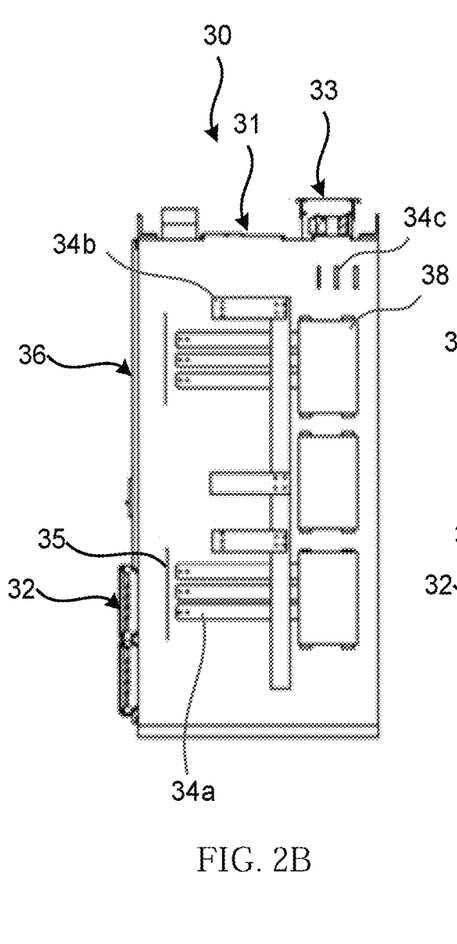
FIG. 2B shows a state in which louvers 32a and 32b of an explosion-proof shutter part 32 are closed due to the pressure increase in the board caused by the arc flash.
Figure 2C:
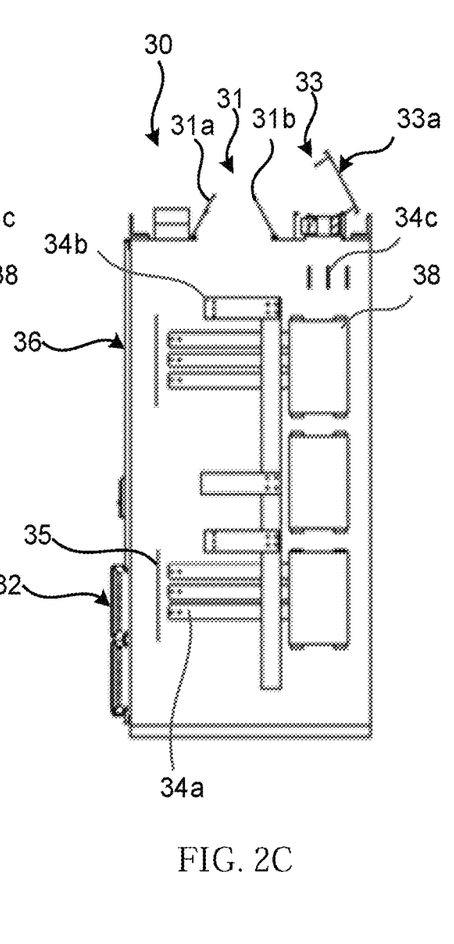
FIG. 2C shows a state in which the flapper section 31 and the fan cover portion 33 are opened due to the pressure increase in the board caused by the explosion-proof shutter part 32 being closed in FIG. 2B.

FIGS. 2A, 2B and 2C are a side perspective view showing a state where the arc flash 37 occurs in the board shown in FIGS. 1A and 1B. Here, a case where an arc flash occurs inside the board unit 30 will be mainly described.

A front door 36 is arranged on the front of the board unit 30. An insulating plate 35 is arranged between the front door 36, which is the operation surface, and the front side conductor 34a in the board. An upper conductor 34b is arranged near the flapper section 31. Another upper conductor 34c is arranged below the fan cover portion 33. Further, a semiconductor unit 38 and the like are stored in the board.

FIG. 2A shows a state immediately after the arc flash 37 occurs inside the board unit 30.

Figure 3A:
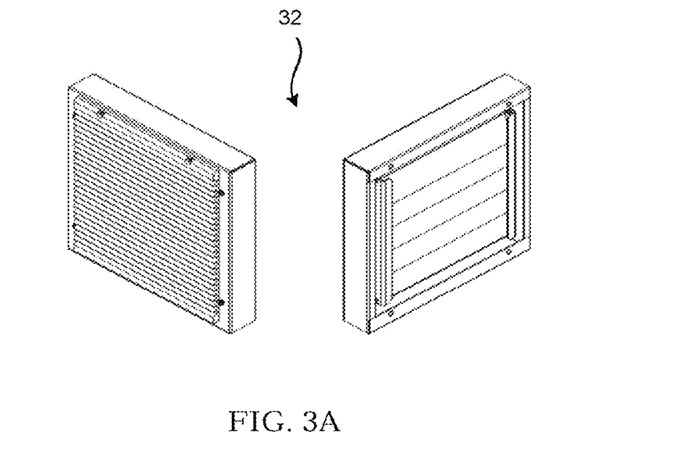
FIG. 3A is an external view of the explosion-proof shutter part used for the front door of the board unit shown in FIGS. 1A and 1B or FIGS. 2A, 2B and 2C.
Figure 3B:
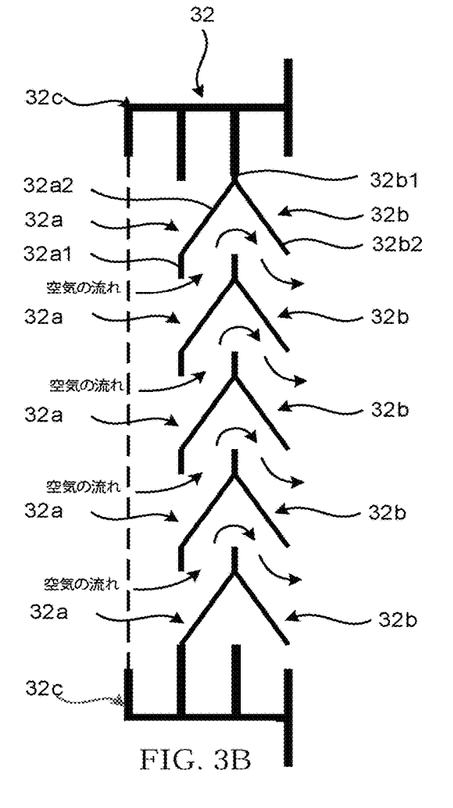
FIG. 3B is a schematic side view for explaining the structure of the explosion-proof shutter part 32, showing a state before an arc flash occurs.
Figure 3C:
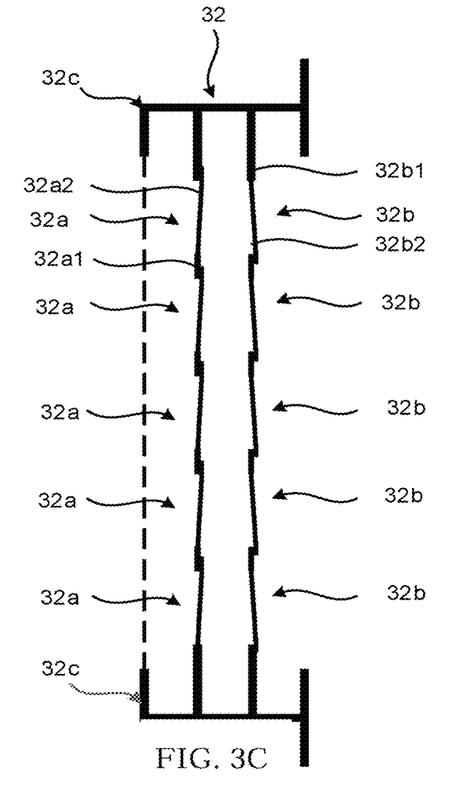
FIG. 3C is a schematic side view for explaining the structure of the explosion-proof shutter part 32, and is a diagram showing a state in which the louvers 32a and 32b are closed due to arc flash generation and board pressure.

FIG. 2B shows a state in which the arc flash 37 is generated inside the board unit 30 and the louvers 32a and 32b forming the explosion-proof shutter part 32 are closed due to the pressure inside the board (see FIG. 3C). The closing of the louvers 32a and 32b prevents the arc flash 37 from being emitted from the explosion-proof shutter part 32 toward the front door 36.

FIG. 2C shows a state in which the flapper section 31 and the fan cover portion 33 are opened due to the pressure increase in the board due to the closing of the explosion-proof shutter part 32 in FIG. 2B.

FIG. 3 is an external view of the explosion-proof shutter part 32 used for the door of the board shown in FIGS. 1A and 1B or FIGS. 2A, 2B and 2C, and a diagram for explaining the operation when the arc flash occurs.

FIG. 3A is an external view of the explosion-proof shutter part 32, and the drawing on the left side is an external view of the explosion-proof shutter part 32 as viewed from the outside of the board unit.

The drawing on the right side is an external view of the explosion-proof shutter part 32 as viewed from the inside of the board unit.

FIG. 3B is a schematic side view for explaining the structure of the explosion-proof shutter part 32, and is a diagram showing a state before the arc flash occurs.

The explosion-proof shutter part 32 is composed of a plurality of movable louvers 32a and a plurality of movable louvers 32b in a frame body 32c made of metal. In this embodiment, the movable louvers 32a and 32b are each composed of five movable louvers made of metal.

The movable louver 32a is composed of a fixed portion 32a1 and a movable portion 32a2, which are formed by bending a substantially rectangular thin plate-shaped metal in parallel with the long side, and is bent so that the movable portion 32a2 is larger than the fixed portion 32a1. Here, the thin plate-shaped metal is, for example, a metal plate having a thickness of about 1 mm.

The movable louver 32a is fixed and attached to the frame body 32c with the fixed portion 32a1 so that the movable portion 32a2 is located above the fixed portion 32a1. In the movable louver 32a, the movable portion 32a2 is bent and attached to the board unit side, and the movable portion 32a2 can be moved in a direction in which the movable portion 32a2 and the fixed portion 32a1 are in a single plane, namely, that can be moved in the direction of outside the board.

The movable louver 32a has a movable portion 32a2 that is bent and attached to the board unit side. At the bent portion, the movable portion 32a2 is movable in a direction in which the movable portion 32a2 and the fixed portion 32a1 form a single plane, that is, to the board outside direction. In the explosion-proof shutter part 32, a part of the lower end of the fixed part 32a1 of the one louver 32a is arranged so as to overlap a part of its upper end of the other louver 32a2 when the movable part 32a2 arranged below the louver 32a is moved in the outboard direction.

The movable louver 32b is composed of a fixed portion 32b1 and a movable portion 32b2, which is formed by bending a substantially rectangular plate-shaped metal in parallel with the long side, and is bent so that the movable portion 32b2 is larger than the fixed portion 32b1.

The movable louver 32b is fixed and attached to the frame body 32c with the fixed portion 32a1 such that the movable portion 32a2 is located below the fixed portion 32b1.

In the movable louver 32b, the movable portion 32b2 is bent and attached to the board unit side, and the movable louver 32b is movable in a direction in which the bent portion and the fixed portion 32b1 are in a single plane, that is, to the board outside direction. In the explosion-proof shutter part 32, a part of the lower end of the fixed part 32b1 of one louver 32b is arranged so as to overlap a part of upper end of the movable part 32b2 of the other louver 32b when the movable part 32b2 arranged below the louver 32b is moved to the outside of the board.

In this embodiment, the movable louver 32a and the movable louver 32b are configured to have a double structure, the movable louver 32a is arranged outside the board, and the movable louver 32b is arranged inside the board.

Before the arc flash occurs, since the air inside the board is discharged from the ceiling side by the operation of the exhaust fan on the ceiling of the board unit (not shown), the movable part 32a2 of the louver 32a and the movable part 32b2 of the louver 32b are held in a bent state toward the inside of the board. Therefore, a gap is formed between one movable louver 32a and other movable louver 32a, and between one movable louver 32b and other movable louver 32b that that is overlapped each other, respectively. As a result, air permeability between the inside of the explosion-proof shutter part 32 and the outside of the explosion-proof shutter part 32 is ensured. In the illustrated example, the wind flows from the outside to the inside of the explosion-proof shutter part in the direction indicated by the arrow.

FIG. 3C is a schematic side view for explaining the structure of the explosion-proof shutter part 32, and is a diagram showing a state in which an arc flash occurs and the louvers 32a and 32b are closed by the pressure inside the board. When an arc flash occurs and the internal pressure of the board becomes higher than the external pressure, the movable portion 32a2 of the movable louver 32a and the movable portion 32b2 of the movable louver 32b are bent outside the board around the fixed portions 32a1 and 32b1. As a result, in the explosion-proof shutter part 32, a part of the lower end of the fixed part 32a1 of one louver 32a overlaps a part of the upper end of the movable part 32a2 of one louver 32a arranged below the other louver 32a. Similarly, in the explosion-proof shutter part 32, a part of the lower end of the movable part 32b2 of one louver 32b overlaps a part of the upper end of the fixed part 32b1 of one louver 32b arranged below the other louver 32b.

As a result, as shown in the figure, the two louvers 32a and 32b are arranged in a parallel state to prevent the arc or pressure due to the arc flash generated in the board from being released from the inside of the louvers 32a and 32b to the outside. The same operations are applied to the louvers of the explosion-proof shutter parts 12, 22, and 42 arranged in the other board units 10, 20, and 40, respectively.

With such a structure, it becomes difficult to blow out the arc, high temperature gas, pressure wave, etc. due to the arc flash generated in the power conversion apparatus from the front of the power conversion apparatus.

In the embodiment shown in FIG. 3, the explosion-proof shutter part 32 is composed of the double shutter of the louver 32a and the louver 32b, but only one louver 32a or the louver 32b may be used. Further, in the embodiment, one metal plate is bent to form the louvers 32a and 32b, but it may be configured that the fixed portions 32a1 and 32b1 are formed by round rod-shaped shafts, and the plate-shaped movable portions 32a2 and 32b2 are formed on the fixed portions 32a1 and 32b1 so that they can rotate around each axis of the shafts.

Figure 4A:
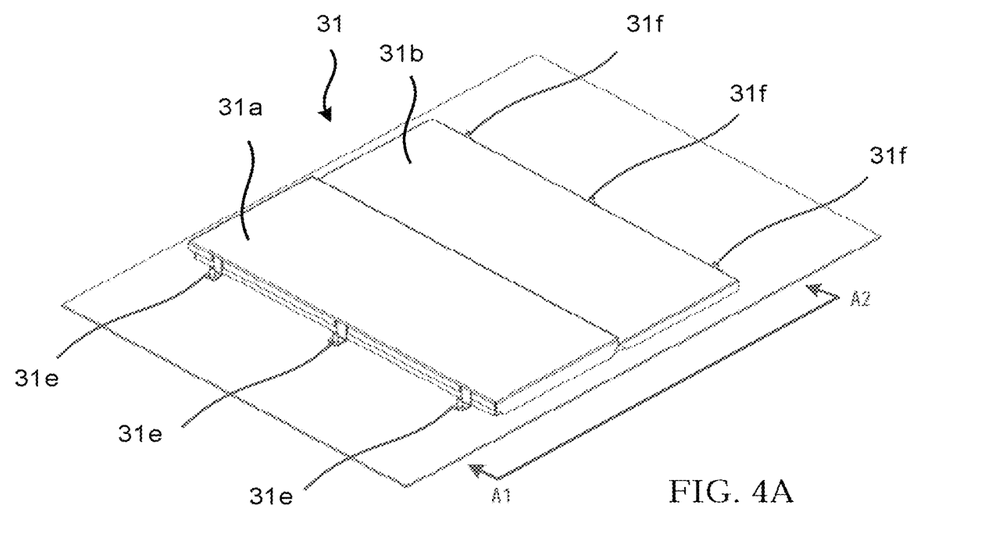
FIG. 4A is an external view when the flapper section 31 arranged on the ceiling of the board unit 30 is closed.
Figure 4B:
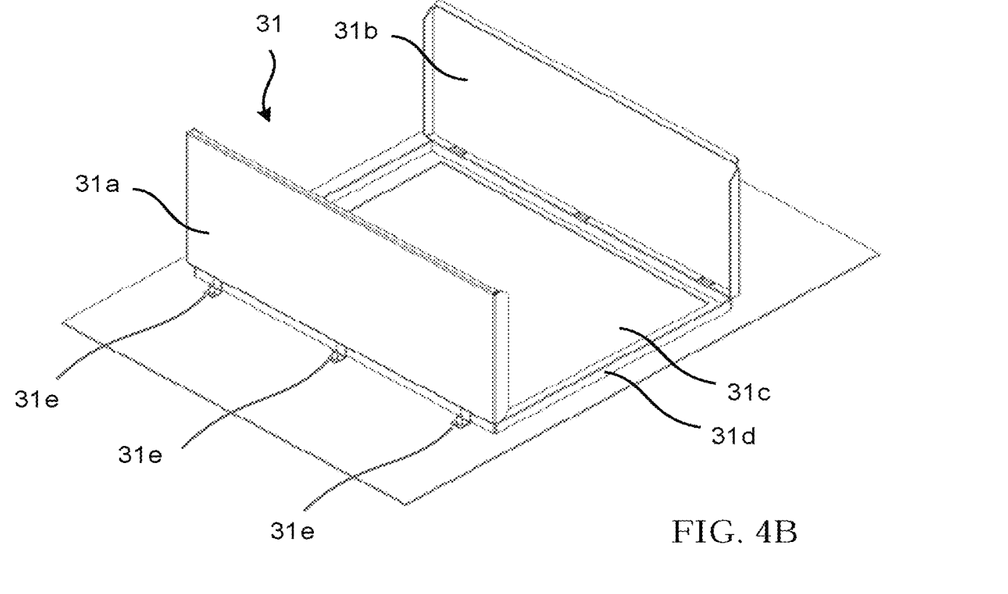
FIG. 4B is an external view when the flapper section 31 arranged on the ceiling of the board unit 30 is open.
Figure 4C:
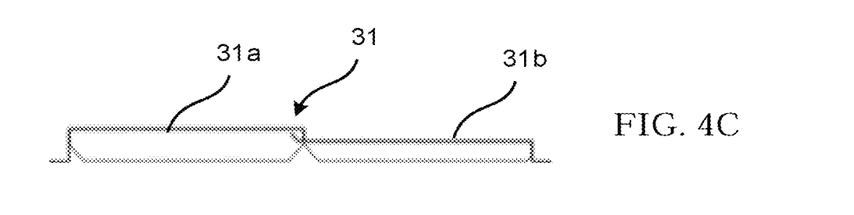
FIG. 4C is a side view of the door of the flapper section 31 when viewed from A1-A2 in FIG. 4A.

FIG. 4 is an external view of the flapper section 31 installed on the ceiling of the board unit shown in FIGS. 1A and 1B and a diagram for explaining the operation when an arc flash occurs. Here, the flapper section 31 arranged on the ceiling of the board unit 30 will be mainly described, but even if the flapper sections arranged on the ceilings of other board units have different shapes, arrangement positions, etc., their functions and operations are basically same.

FIG. 4A is an external view when the flapper section 31 arranged on the ceiling of the board unit 30 is closed. The normal state is the state shown in FIG. 4A. FIG. 4B is an external view when the flapper section 31 arranged on the ceiling of the board unit 30 is open.

The flapper section 31 has a window portion 31c, a frame body 31d arranged around the window portion 31c, and two doors 31a and 31b fixed to both ends of the frame body 31d by hinges 31e and 31f.

Since the doors 31a and 31b are for opening and closing the window 31c, a door having a size necessary for opening and closing the window 31c is required. In this embodiment, the doors 31a and 31b are fixed to the frame body 31d by hinges 31e and 31f, respectively, so that the doors 31a and 31b can be opened and closed like a double door in the central portion of the window 31c. Further, the material of the doors 31a and 31b of the present embodiment is made of sheet metal having a thickness of 1.6 mm, and the tip portions of the two doors are arranged so that they overlap in the central part of the window portions 31c when the two doors 31a and 31b are closed.

Further, both side portions of the door are bent inward in an L-shape and are configured to come into contact with a frame body 31d surrounding the window portion 31c, and a predetermined airtightness is kept when the doors 31a and 31b are closed. The predetermined airtightness is a level of airtightness that does not hinder the required intake of air from the explosion-proof shutter parts 12, 22, 32, and 42 when the exhaust fan of the board unit (not shown) is operating. FIG. 4C is a side view of the door of the flapper section 31 when viewed from A1-A2 in FIG. 4A. The tip portion of the door 31a of the present embodiment is arranged so as to overlap the tip portion of the door 31b.

When the arc flash occurs, the flapper section 31 can release the doors 31a and 31b as shown in FIG. 4B due to the pressure increase in the board, and release the expanded air in the board unit.

Figure 5:
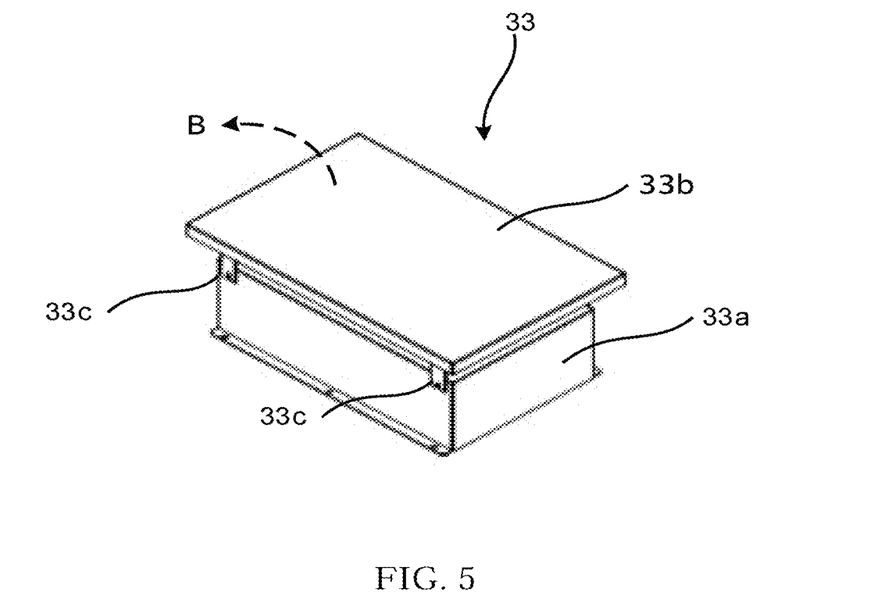
FIG. 5 is an external view of a fan cover portion 33 used on the ceiling of the board unit shown in FIGS. 2A, 2B and 2C, and a diagram for explaining the operation when an arc flash occurs.

FIG. 5 is an external view of the fan cover portion 33 arranged on the ceiling of the board unit shown in FIGS. 2A, 2B and 2C and a diagram for explaining the operation when an arc flash occurs. Here, the fan cover portion 33 arranged on the ceiling of the board unit 30 will be mainly described.

The fan cover portion 33 is configured to have a frame body 33a and a door 33b.

The frame body 33a according to the present embodiment is configured in a box shape, and an exhaust fan (not shown) is housed inside the frame body 33a. There is a space between the frame body 33a and the door 33b.

The door 33b is rotatably fixed to one end of the frame body 33a by a hinge 33c. The door 33b is normally in the state shown in FIG. 5, and the exhaust gas of the exhaust fan is discharged to the outside of the board unit from the space between the frame body 33a and the door 33b.

When an arc flash occurs, the door 33b can rotate in the direction of arrow B in the drawing due to the pressure increase in the board. By rotating the door 33b, the area of the opening of the exhaust fan portion increases, and the pressure increase in the board can be suppressed.

Figure 6:
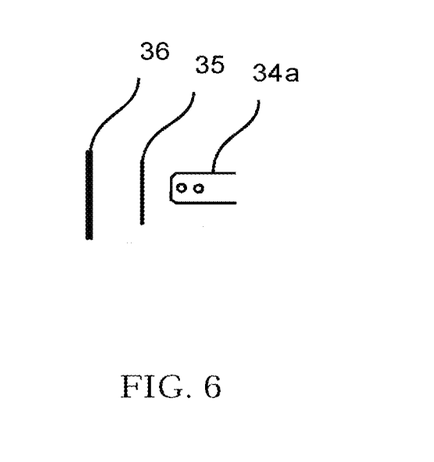
FIG. 6 is a diagram showing a case where an insulating plate 35 is arranged between a conductor in the board unit shown in FIGS. 1A and 1B and a front door.

FIG. 6 is a detailed explanatory view of the case where the insulating plate 35 is arranged between the conductor 34a near the front surface of the board shown in FIGS. 2A, 2B, and 2C and the metal front door 36 of the board unit 30. A large current flows in the arc flash. Therefore, to prevent dielectric breakdown in places where people do not want to generate an arc flash, such as parts that may come close to the power conversion apparatus during operation, for example, near the front door in the board, the sharp end of the conductor end is removed, and the conductor is rounded to make the electric field relatively weaker than other parts (first end processing).

On the other hand, in order to prevent the arc flash from occurring in an unintended place, a relatively safe place is set even if an arc flash occurs. For example, the electric field of the conductor is strengthened relative to other parts so that dielectric breakdown can be easily occurred near the pressure release opening at the top of the board when an overvoltage occurs. Therefore, the shape of a part of the upper part of the board is processed into a sharp state (second processing).

In this embodiment, in order to prevent dielectric breakdown from the conductor 34a on the front surface of the board to the front door 36, or to prevent dielectric breakdown between the conductors, the first tip processing to make a rounded portion for removing a sharp end portion of the conductor 34a is provided. The insulating plate 35 is arranged between the conductor 34a and the front door 36 in order to secure the further insulating property while performing the first tip processing. In addition, the conductor 34b near the flapper section 31 on the upper part of the board and the conductor 34c near the fan cover portion 33 are subjected to the second processing in which a part is sharpened.

By performing such processing, when the conductors 34a, 34b, and 34c have the same potential, the surface electric field of the conductor 34a becomes weaker than that of the conductors 34b and 34c. Therefore, since the probability of dielectric breakdown at the portion of the conductor 34a is lower than the probability at the portions of the conductors 34b and 34c, the occurrence probability of arc flash at the portion of the conductor 34a can be reduced.

The insulating plate 35 arranged between the conductor 34a and the front door 36 is arranged at a position close to the conductor 34a side (see FIGS. 2A, 2B, and 2C).

With such a configuration, if an overvoltage occurs in the power conversion apparatus 100 for some reason, the probability that an arc flash will occur in the conductor 34a will be lower than the probability that it will occur in the conductor 34b or the conductor 34c. Further, since the flapper section 31 and the fan cover portion 33 are present in the vicinity of the conductors 34b and 34c, it is possible to reduce the influence on the person near the front door 36 of the board unit 30 when an arc flash occurs. Because the pressure wave generated by opening the doors 31a and 31b and the fan cover portion 33 is discharged from the upper portion of the board unit 30 to the outside.

Figure 7:
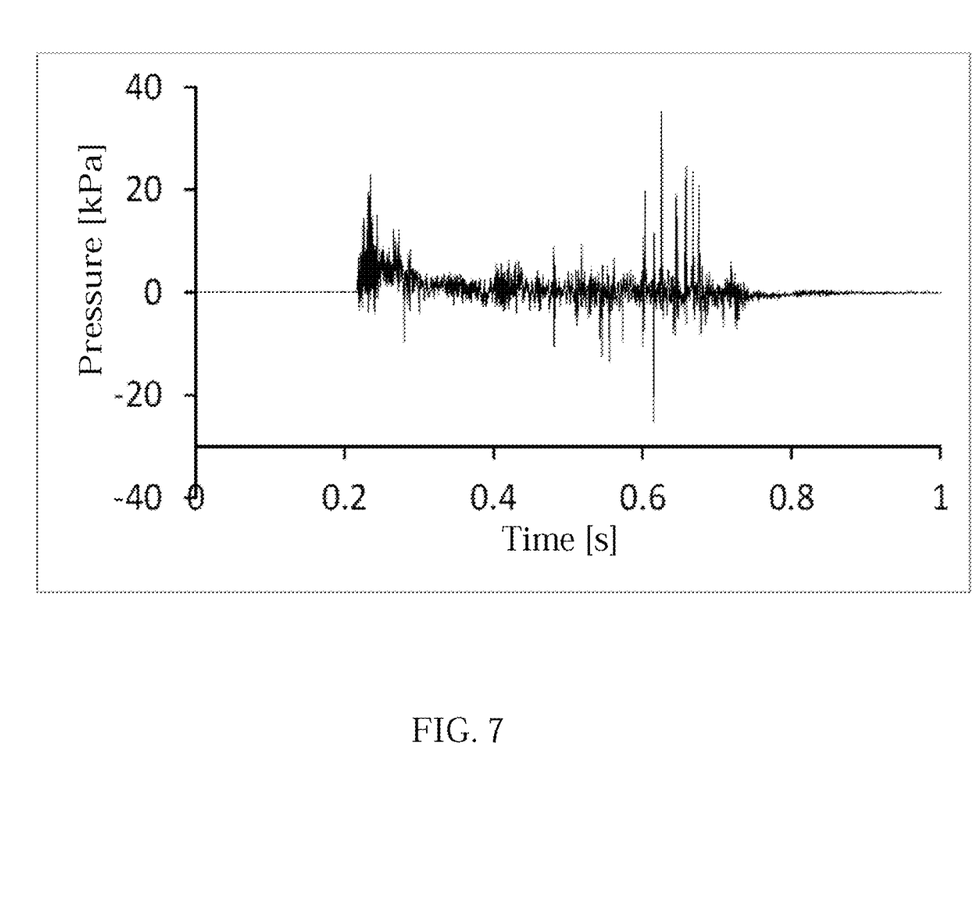
FIG. 7 is an example of a test result of a change in in-board pressure when an arc flash is generated in the power conversion apparatus.

FIG. 7 shows an example of a test result of changes in the board pressure when an arc flash is generated in the power conversion apparatus in the embodiment of the power conversion apparatus according to the present invention. The vertical axis is the pressure difference between the outside and inside of the board, and the horizontal axis is the time axis.

As shown in FIG. 7, it is shown that the rise of the pressure inside the board is suppressed by the effect of the flapper section and the fan cover portion that can release pressure on the upper part of the board.

While certain embodiment have been described, the embodiment has been presented by way of example only, and are not intended to limit the scope of the inventions. Indeed, the novel embodiment described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the inventions.

As described above, according to the present invention, it is possible to provide the power conversion apparatus that can prevent the high temperature gas and the pressure wave due to the arc flash generated in the board from being emitted to the operation surface and to reduce the damage to the components in the board.

EXPLANATION OF SYMBOLS 100 power conversion apparatus (board)
10, 20, 30, 40 board unit
12, 22, 32, 42 explosion-proof shutter part
31, 41 flapper section
31a, 31b doors
31c window portion,
31d frame body
32a, 32b movable louver
33, 43 fan cover portion
33a frame body
33b door
33c hinge
34 conductor
35 insulating plate
36 housing
37 arc flash

The invention claimed is:

1. A power conversion apparatus for driving a motor, comprising:
   a first conductor portion;
   a second conductor portion;
   an openable/closable board door;
   a vent hole arranged in the board door, and
   a flapper section on a ceiling part,
   wherein,
   the first conductor portion, which is arranged at a place where arc flash is not desired to be generated, is subjected to a first processing for relaxing a surface electric field of the first conductor portion as compared with the second conductor portion,
   the vent hole has a shutter part composed of a plurality of louvers consisting of a fixed part that makes a fulcrum composed of a plurality of metal plates, and a movable part,
   the plurality of louvers has the movable part arranged so as to overlap the fixed part of another louver when the movable part of one louver rotates in the outer direction of the power conversion apparatus, and
   the plurality of louvers are configured to ensure air permeability from outside to inside of the power conversion apparatus when the movable part of the plurality of louvers rotates in the inner direction of the power conversion apparatus, and the flapper section includes:
a window portion arranged between the inside and the outside of the power conversion apparatus;
a frame body arranged around the window portion, and
two doors fixed to both ends of the frame body so as to be opened and closed in a double door shape toward the outside of the power conversion apparatus at a central portion of the window portion.

2. The power conversion apparatus as claimed in claim 1, wherein, in the two doors that are fixed on both sides of the flapper section so that they can be opened and closed, a front end portion of the board door is arranged so as to overlap with the central portion of the window portion, and both side portions of the door are bent inwardly in a L-shape and a predetermined airtightness is secured by contacting with the frame body, during the closed state.

3. The power conversion apparatus as claimed in claim 1, further having a fan cover on a ceiling portion of the power conversion apparatus, and the fan cover is configured to be opened to the outside of the power conversion apparatus.

4. The power conversion apparatus as claimed in claim 1, wherein, the first processing is the processing that removes a sharp portion of a shape of a first conductor end portion and performs rounding of it.

5. The power conversion apparatus as claimed in claim 1, wherein, a place where the arc flash is not desired to be generated is between the board door and the first conductor portion that is arranged in the vicinity thereof, and an insulating plate is attached between the board door and the first conductor portion, and the second conductor portion is arranged near the flapper section.

6. The power conversion apparatus as claimed in claim 5, wherein, the second conductor portion is subjected to a second processing for strengthening a surface electric field of the second conductor portion as compared with other portions.

7. The power conversion apparatus as claimed in claim 1, wherein, when the arc flash occurs and an internal pressure of the power conversion apparatus is higher than an external pressure, the movable part of the plurality of louvers of the shutter part is configured to rotate to the outside of the power conversion apparatus so as to close the shutter part, and the flapper section is configured to open to the outside of the power conversion apparatus.

* * * * *